US008116998B2

(12) United States Patent
Hess

(10) Patent No.: US 8,116,998 B2
(45) Date of Patent: Feb. 14, 2012

(54) BATTERY HEALTH ASSESSMENT ESTIMATOR

(75) Inventor: Robert A. Hess, Newark Valley, NY (US)

(73) Assignee: BAE Systems Controls, Inc., Johnson City, NY (US)

( * ) Notice: Subject to any disclaimer, the term of this patent is extended or adjusted under 35 U.S.C. 154(b) by 421 days.

(21) Appl. No.: 12/363,324

(22) Filed: Jan. 30, 2009

(65) Prior Publication Data
US 2010/0198536 A1  Aug. 5, 2010

(51) Int. Cl.
H02J 7/00 (2006.01)
G06F 17/00 (2006.01)

(52) U.S. Cl. .............. 702/63; 702/64; 702/65; 702/180; 320/134; 320/136

(58) Field of Classification Search .................... 702/63, 702/65, 64, 180
See application file for complete search history.

(56) References Cited

U.S. PATENT DOCUMENTS

| 5,539,318 | A | 7/1996 | Sasaki |
| 6,163,135 | A | 12/2000 | Nakayama et al. |
| 6,215,312 | B1 * | 4/2001 | Hoenig et al. ................. 324/427 |
| 6,759,832 | B2 | 7/2004 | Minamiura et al. |
| 6,836,122 | B2 | 12/2004 | Tojima |
| 7,061,246 | B2 | 6/2006 | Dougherty et al. |
| 7,109,685 | B2 | 9/2006 | Tate, Jr. et al. |
| 7,154,247 | B2 | 12/2006 | Kikuchi et al. |
| 7,200,499 | B2 | 4/2007 | Aridome |
| 7,315,789 | B2 | 1/2008 | Plett |
| 7,321,220 | B2 | 1/2008 | Plett |
| 2006/0100833 | A1 | 5/2006 | Plett |
| 2006/0111854 | A1 | 5/2006 | Plett |
| 2006/0111870 | A1 | 5/2006 | Plett |
| 2007/0005276 | A1 | 1/2007 | Cho et al. |
| 2007/0159137 | A1 * | 7/2007 | Verbrugge et al. ............ 320/132 |
| 2007/0299620 | A1 | 12/2007 | Yun et al. |
| 2008/0094035 | A1 | 4/2008 | Plett |
| 2008/0094069 | A1 * | 4/2008 | Huang .......................... 324/430 |

OTHER PUBLICATIONS

Kay, S., Intuitive Probability and Random Processes Using MATLAB, Springer, 2006, 7 pages.

* cited by examiner

Primary Examiner — Hal Wachsman
(74) Attorney, Agent, or Firm — Scully, Scott, Murphy & Presser, P.C.

(57) ABSTRACT

A battery state of health estimator and similar method, system and computer product is disclosed providing for a estimate of a state of health (SOH) of one or more batteries, comprising, estimating a sampling of internal resistances of the one or more batteries, generating a time history of the internal resistance over a predetermined amount of time, generating a cumulative internal resistance histogram from the time history, calculating a final estimate of internal resistance of one or more batteries which represents the calculated SOH of one or more batteries and comparing the calculated SOH to a predetermined critical resistance threshold. If the calculated SOH is less than the predetermined critical resistance threshold, the battery is in no worse than a "Blue Monday" condition, and if the calculated SOH is greater than the critical resistance threshold, then the one or more batteries has failed.

20 Claims, 7 Drawing Sheets

- Prior Art -

- Prior Art -

BATTERY HEALTH ASSESSMENT ESTIMATOR

BACKGROUND OF INVENTION

1. Field of the Invention

The present invention relates to a method of assessing the health of one or more traction batteries employed in electric and hybrid electric vehicles and more particularly to a method, system, apparatus, and computer product for estimating the state of health of one or more traction batteries arranged in series and/or parallel. Each battery is assumed to be internally composed of one or more cells, also arranged in series and/or parallel.

2. Description of the Related Art

Currently, electric and hybrid electric vehicles employing one or more traction batteries are becoming a popular alternative to conventional vehicles employing an internal combustion engine. Not only are electric and hybrid electric vehicles being phased into traditional automobiles but they are also being implemented in trucks, buses as well as streetcars in so-called fleet operations.

In fleet operations, various vehicle maintenance protocols are typically implemented to assure consistent operation of electric and hybrid electric vehicles. For, example, a vehicle maintenance protocol for a bus fleet would require that each electric and hybrid electric bus be checked by a technician on either a daily or weekly basis to assure that the one or more traction batteries are in proper working order.

The conventional method employed in a typical vehicle maintenance protocol involves one or more of the following methods. One conventional method involves the comparison of battery voltage profiles which requires that a technician remove and access each traction battery to compare the behavior of various traction battery voltages in a pack of traction batteries where data is collected from each traction battery terminal. Outliers from the pack of traction batteries are identified and used to determine if the traction battery is unhealthy. However, outlier analysis has the limitation that it typically requires that several traction batteries be available for comparison. If all the traction batteries in the pack are degrading, outlier analysis would not see any difference between each traction battery.

Another conventional method employs electrochemical impedance spectroscopy where technicians test the electrochemical impedance of a pack of traction batteries after removing each traction battery. Each removed traction battery is then placed on a special test stand and analyzed. However, in fleet operation where a bus for example can have ten or more 600-volt traction batteries integrated deep into the fuselage of the vehicle makes removal of one or more traction batteries very maintenance intensive and costly.

In another conventional method, a technician monitors the open circuit voltage of a single traction battery. If the open circuit voltage is too low, the battery is deemed unusable. However, monitoring the open circuit voltage is a difficult measurement and is difficult to do on an installed battery. Further, in applications where the battery may be recharged, the open circuit voltage changes with state of charge. As it is difficult to know state of charge, it is difficult to quantify the health of the battery.

In yet another conventional method, advanced state estimation techniques are applied to each traction battery using accurate high-frequency data sampling of a single battery. For example, some applications use advanced state estimation techniques to infer battery state of charge or internal impedance. Internal impedance is a common measure for battery health. Typically, battery impedance increases as the battery becomes unhealthy. Internal impedance is not greatly affected by state of charge, hence, it is a good feature for health assessment. Current state estimations techniques are typically applied to a single battery and use highly accurate, high sampling rate data to assess state of charge. Such conventional approaches are used in laboratory applications. In such applications, batteries may only be discharged or use simple charging schemes. For more complex applications, like a stack of traction batteries used in a hybrid electric vehicle with complex charging/discharging cycles, the data is sampled at very slow rates. The voltage and current measurements are typically sampled at much lower accuracy than seen in a laboratory environment.

However, the conventional method employing advanced state estimation suffer from the same drawbacks as the other conventional methods described above, such as being maintenance intensive and costly. Moreover, conventional advanced state estimation also have data bandwidth limitations where the ability to collect high-frequency (kilohertz) data for a large number of traction batteries is not currently available since current applications typically collect data at 1 Hz or slower.

Moreover, none of the above described conventional methods or any other known method in the prior art can detect whether or not a traction battery or a pack of traction batteries is merely suffering what is termed as a "Blue Monday" condition. A Blue Monday condition is a situation where a traction battery sits idle for an extended period of time and shows a degraded status upon conventional assessment techniques. Accordingly, a technician may likely unnecessarily waste time and resources to subject a traction battery to recharging or removal when in fact the battery is merely in a Blue Monday condition.

Having set forth the limitations of the prior art, it is clear that what is required is a method, system, apparatus or computer product which can provide a state estimation technique which can be applied to a single battery without requiring the removal of the battery from the vehicle, can work with low-frequency data sampling and can detect a Blue Monday condition.

SUMMARY OF THE INVENTION

The present invention provides a method of estimating a state of health (SOH) of one or more batteries.

In particular, estimating internal resistances of the one or more batteries, generating a time history of the internal resistances over a predetermined amount of time, generating a cumulative internal resistance histogram from the time history, calculating a final estimate of the internal resistance of the batteries which represents the calculated SOH of the one or more batteries and comparing the calculated SOH to a predetermined critical threshold, resistance, wherein if the calculated SOH is less than the predetermined critical resistance threshold, the one or more batteries are in no worst than a Blue Monday condition, and if the calculated SOH is greater than the predetermined critical resistance threshold, then one or more of the batteries has failed.

In the present invention the sampled internal resistance is estimated by employing a state estimator, which can be a Kalman filter.

In the step of generating a cumulative histogram a further step is included where a step of setting a smallest partition is provided. In particular, in the cumulative internal resistance histogram, the smallest partition is set to zero count.

In another embodiment of the present invention a further subsequent step of determining if the one or more batteries has one or more intermittent or continuously shorted cells is provided, comprising, generating an open circuit voltage (OCV) histogram of a nominal open circuit voltage from each of the one or more batteries, selecting a peak OCV value from the generated OCV histogram, and comparing the selected peak OCV value to a predetermined nominal range. If the selected peak OCV value is outside the predetermined nominal range, the one or more batteries has a shorted cell.

In another embodiment of the present invention there is provided the further subsequent steps of determining the state of charge of the one or more batteries, estimating an open circuit voltage (OCV) of the one or more batteries as a function of a predetermined state of charge and comparing the estimated OCV to another predetermined nominal value. If the estimated OCV is below the other predetermined nominal value, one or more batteries are degraded.

The present invention also provides a system of estimating a state of health (SOH) of one or more batteries, comprising, means for estimating internal resistances of the one or more batteries, means for generating a time history of each of the internal resistances over a predetermined amount of time, means for generating a cumulative internal resistance histogram from the time history, means for calculating a final estimate of the internal resistance of the one or more batteries which represents the calculated SOH of the one or more batteries, and means for comparing the calculated SOH to a predetermined critical resistance threshold. If the calculated state of health is less than the predetermined critical resistance threshold, the one or more batteries are in no worse than a Blue Monday condition, and if the calculated SOH is greater than the predetermined critical resistance threshold then the battery has failed.

An additional object of the present invention is to provide a program storage device readable by a machine, tangibly embodying a program of instructions executable by the machine to perform the above-described estimation of the state of health (SOH) of one or more batteries.

BRIEF DESCRIPTION OF THE DRAWINGS

The objects, features and advantages of the present invention will become apparent to one skilled in the art, in view of the following detailed description taken in combination with the attached drawings, in which.

DETAILED DESCRIPTION

Figure 1:
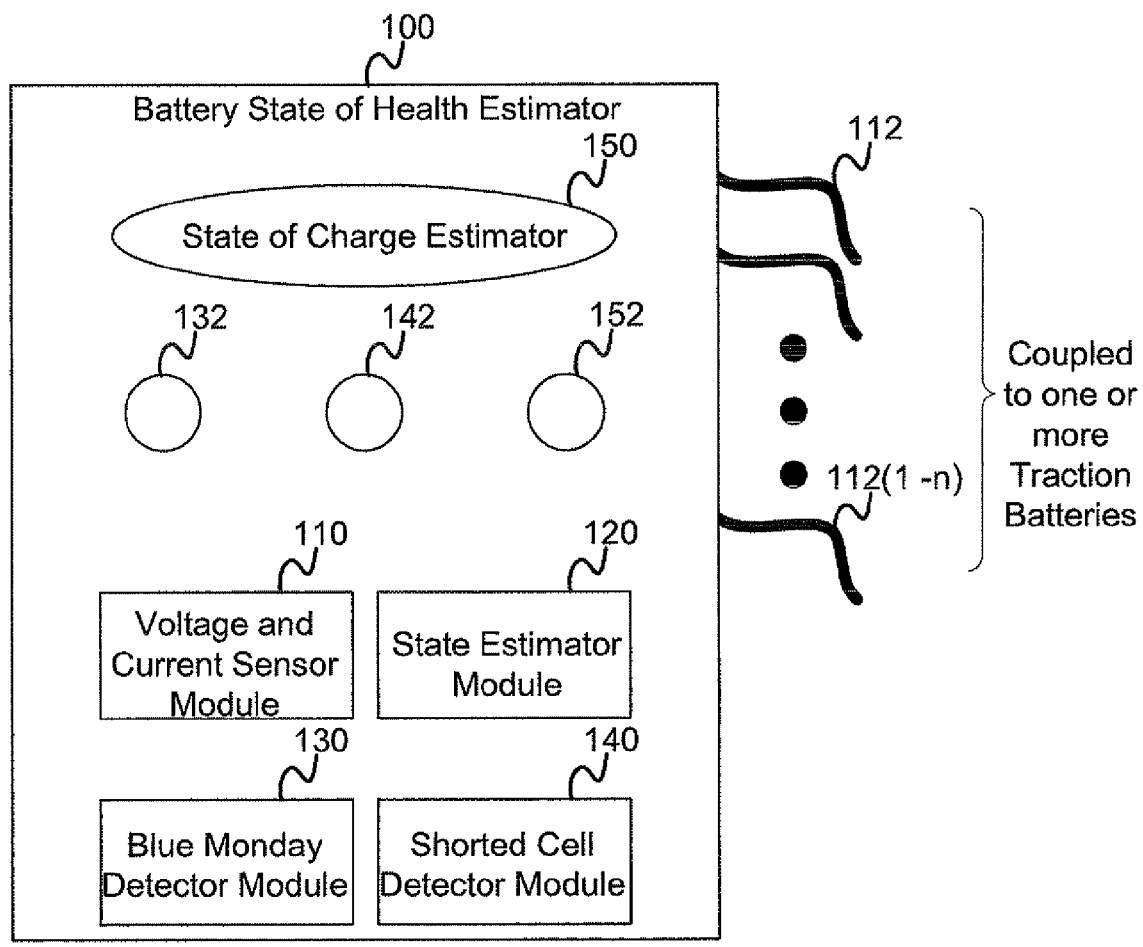
FIG. 1 is a battery state of health estimator according to one embodiment of the present invention.

Hereinafter, embodiments of the present invention will be described with reference to the accompanying drawings. It should be noted that the similar components are designated by similar reference numerals although they are illustrated in different drawings. For the purposes of clarity and simplicity, a detailed description of known functions and configurations incorporated herein will be omitted as it may obscure the subject matter of the present invention.

FIG. 1 is an illustration of a battery state of health (SOH) estimator according to one embodiment of the present invention. As shown in FIG. 1, a battery state of health (SOH) estimator 100 includes a voltage and current sensor module 110, which obtains voltage and current measurements from a direct connection to the terminals of one or more traction batteries (not shown) by way of connection leads 112 to 112(1-$n$). State estimator module 120, as more thoroughly explained below, provides estimates of the system states of one or more traction batteries. Blue Monday detector module 130 determines whether a particular battery has failed or is in no worse than a Blue Monday condition by comparing a predetermined resistance threshold to a calculated SOH. Shorted cell detector module 140 determines if a peak open circuit voltage (OCV) value from a histogram of the open circuit voltage is outside a predetermined nominal range, and if the peak OCV is outside the normal range then the battery has a shorted celled. The state of charge estimator 150 determines that if an estimated open circuit voltage is below a predetermined nominal value, then the battery is degraded.

Indicators 132, 142, and 152 are LEDs or other devices capable of indicating a status by illuminating as known in the art. Indicator 132 is coupled to the Blue Monday detector module and when illuminated indicates that the battery has failed. Indicator 142 coupled to the shorted cell detector module illuminates to indicate that a cell in a traction battery is shorted. Indicator 152 coupled to the state of charge estimator illuminates to indicate a traction battery is degraded. If none of the indicators 142, or 152 are illuminated, the traction batteries being monitored are in normal operating condition, and in the case of indicator 132, that the traction batteries are in no worse than a Blue Monday condition.

Figure 2:
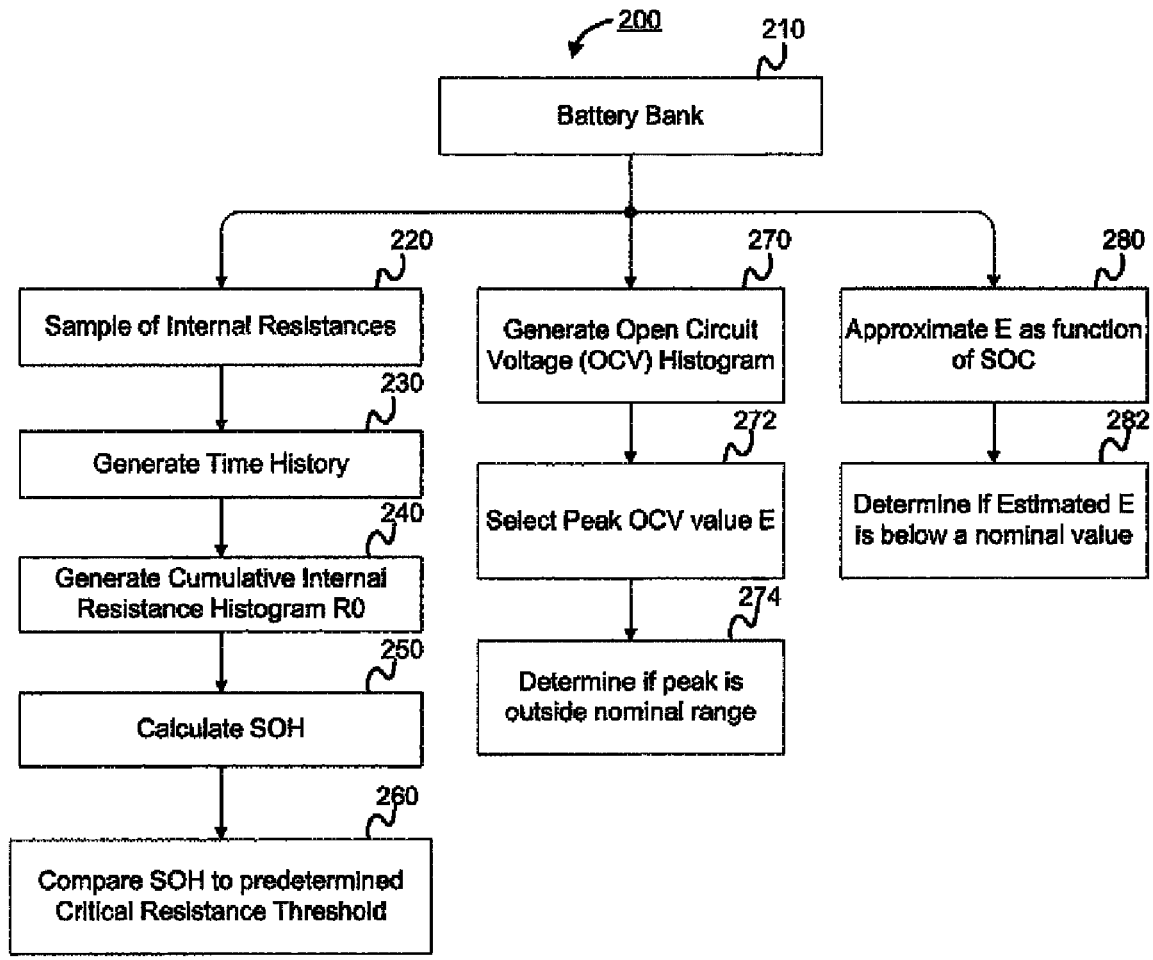
FIG. 2 is an illustration of a flow diagram showing the method of assessing the state of health of one or more batteries according to one embodiment of the present invention.

Referring now to FIG. 2, the operation of the method of assessing the state of health of one or more batteries will now be described according to one aspect of the invention. In FIG. 2 a flow diagram showing the method of assessing the state of health of one or more batteries 200 according to one embodiment of the present invention is shown. In FIG. 2, a battery bank 210 is shown. The present invention first generates estimates of a sampling of the internal resistances 220 of the one or more batteries in the battery bank 210 employing a state estimator, discussed below. A time history 230 of the sampled of internal resistances are generated over a predetermined amount of time and stored in a memory such as a random access memory RAM. A cumulative histogram 240 as known to those skilled in the art is generated from the stored time history which is a mapping that counts the cumulative number of observations over time in uniform subintervals called "bins." That is, as known in the art, the cumulative histogram $M_i$ of a histogram $m_i$ is defined as:

$$M_i = \sum_{i=1}^{k} m_i.$$

The amount of time required to generate a statistically reliable time history can take as long as ten to fifteen minutes, as known to those skilled in the art. After a statistically reliable time history is obtained, and a cumulative histogram is generated, a final estimate of the internal resistance of the one or more batteries, which represents the calculated state of health (SOH) 250 of the one or more batteries. The calculated SOH is compared to a predetermined critical resistance threshold 260, wherein if the calculated SOH is less than the predetermined critical resistance threshold, one or more of the batteries are in no worse than a Blue Monday condition, and if the calculated SOH is greater than the critical resistance threshold, then one or more of the batteries has failed and needs to be replaced. The present invention's method recognizes as known in the art the fact that as batteries get unhealthy, the internal resistance will increase. However, in a Blue Monday condition, an increase in the battery's internal resistance does not mean that the battery has failed and needs to be replaced.

As mentioned above, the step of generating samples of the internal resistances 220 of the one or more batteries in the battery bank 210 can be carried out by way of a state estimator. As known in the art, a state estimator such as a non-linear Kalman filter can be employed to optimally combine measurements (current and voltage) within a set of state equations to provide estimates of samples of the internal resistances of the batteries. A Kalman filter is a recursive filter that estimates the state of a dynamic system from a series of incomplete and noisy measurements by providing estimations of past, present, and even future states, and it can do so even when the precise nature of the modeled system is unknown.

After running the state estimator and generating a time history of the estimated sampling of internal resistances, a cumulative histogram R0 240 of each battery is generated and an open circuit voltage E histogram 270 from the open circuit voltage of each battery is also generated. At the same time an approximate open circuit voltage is calculated as a function of a state of charge 280. The generation of the above referenced histograms is well known in the art and in literature such as *Intuitive Probability and Random Processes using Matlab*, by Steve Kay, page 14, published by Springer in 2006.

In the present invention, the first value of the internal resistance histogram bin (related to a resistance value of 0) is set to zero to aid in selecting a peak resistance value as will be explained later when referring to FIG. 6(b). The reason for this step of setting the 0 bin to zero as it is well known in the art in that it is physically impossible to consider any peaks at zero resistance. The value of the predetermined critical resistance threshold would be determined from the tolerances listed in datasheets available from battery manufacturers, which would list what the maximum value of the internal resistance of a battery could be before it could be determined that the battery has failed.

A shorted battery cell condition is determined by picking a peak value 272 of the open circuit voltage E histogram 270. A shorted cell is determined by evaluating whether the selected peak value 272 of the open circuit voltage histogram 270 is outside a predetermined nominal range 274. The predetermined nominal range is determined from the tolerances listed in datasheets available from battery manufacturers. If the selected peak value 272 is outside the predetermined nominal range, a flag is triggered or in case of the apparatus of FIG. 1, LED 142 would illuminate to indicate that at least one cell of the battery is, in fact shorted.

To determine if one or more traction battery's current capacity is degraded, as known in the art, an estimated open circuit voltage is calculated as a function of a state of charge 280 and if the estimated open circuit voltage is determined to be below a predetermined nominal value 282, a flag is triggered or in case of the apparatus of FIG. 1, LED 152 would illuminate. Again, this predetermined nominal value is determined from the tolerances listed in data's sheets available from battery manufactures. Obviously, if LED 152 is not illuminated one or more traction battery's current capacity is not degraded.

Figure 3A:
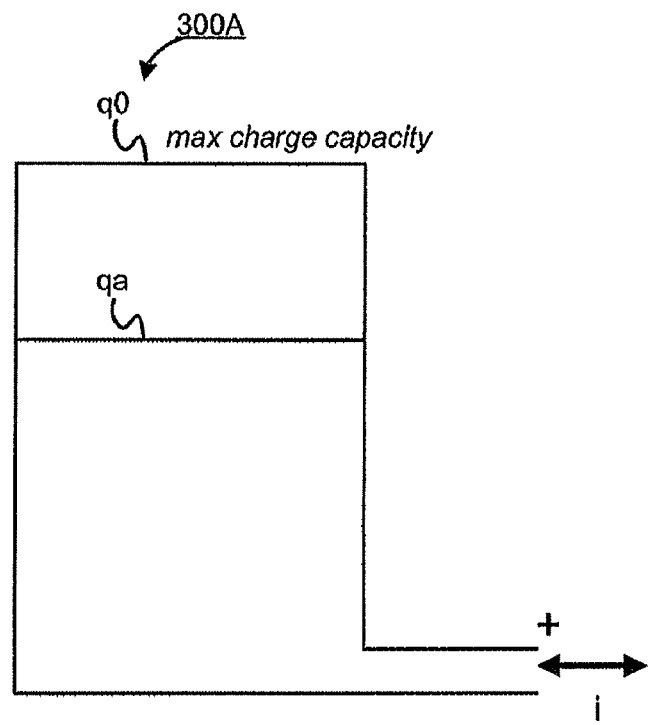
FIG. 3(a) is an illustration of a representative prior art charge well model of a battery.
Figure 3B:
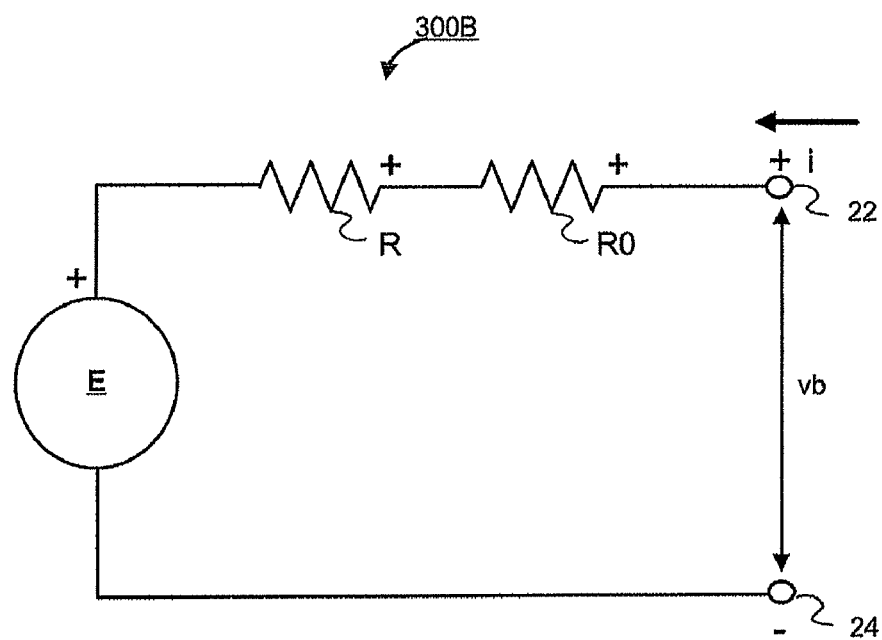
FIG. 3(b) is a prior art circuit schematic illustration of a representative voltage source model for a battery.

To more thoroughly understand the state estimator of module 120 of FIG. 1 and the state estimator 220 of FIG. 2 and the present invention's method of assessing a battery's health, the following background explanation is provided. FIGS. 3(a) and 3(b) are provided to illustrate generic models of a battery or a so-called Sheppard's model as known in the art. FIG. 3(a) is an illustration of a representative charge well model of a battery. In FIG. 3(a), a battery charge well 300A reflects the state of charge, which is directly related to the current i flowing in and out of the battery. Also shown in FIG. 3(a) is the available (current) charge qa in the battery and the maximum charge capacity q0.

FIG. 3(b) is a circuit schematic illustration of representative voltage source model for a battery. As shown in FIG. 3(b), a battery can also be modeled as a complex voltage source which has relationships between the internal impedance, open circuit voltage, state of charge (SOC) and battery terminal voltage. The state equations for the system of FIGS. 3(a) and 3(b) at time step j are given by the following formulations:

Charge Well Relationship:

$$qa_j = qa_{j-1} + i_j \Delta t \qquad \text{(Equation No. 1)}$$

Voltage Source Relationship:

$$v_{bj} = (E0_{j-1} + K_{j-1}\text{signum}(i_j)Q\text{norm}_{j-1}) + i_j R0_{j-1} + i_{j-n} R_{j-1},$$
$$n = 1 \text{ or } 2 \qquad \text{(Equation No. 2)}$$

$$E0_j = E0_{j-1}$$

$$R0_j = R0_{j-1}$$

$$R_j = R_{j-1}$$

$$K_j = K_{j-1}$$

where:
qa—available (current) charge in battery
$v_b$—terminal voltage
E0—open circuit voltage at 0% SOC
Qnorm—normalized charge term
i—current
R0—equivalent battery resistance
R—dynamic resistance term The open circuit voltage (E) is defined as:

$$E = E0 + K\text{signum}(i)Q\text{norm} \qquad \text{(Equation No. 3)}$$

where:

$$q_r/q_0 \text{ Positive } i \quad (22)$$

$$Q\text{norm} = (q_0 - q_a)/q_0 \text{ Negative } i \quad (24)$$

$q_0$—total charge capacity of battery

Accordingly, the above formulation renders six (6) states ($v_b$, qa, E0, R0, R, and K) and one system input (current—i). It should be noted that only one of the states is measured, the battery terminal voltage across positive terminal 22 and negative terminal 24, vb. As known in the art, the above equations numbers 1-3 can be used within a state estimator such as a non-linear Kalman filter to optimally combine the measurements (current and voltage) within the state equations to provide estimates of the internal resistance of the batteries.

Figures 4A, 4B:
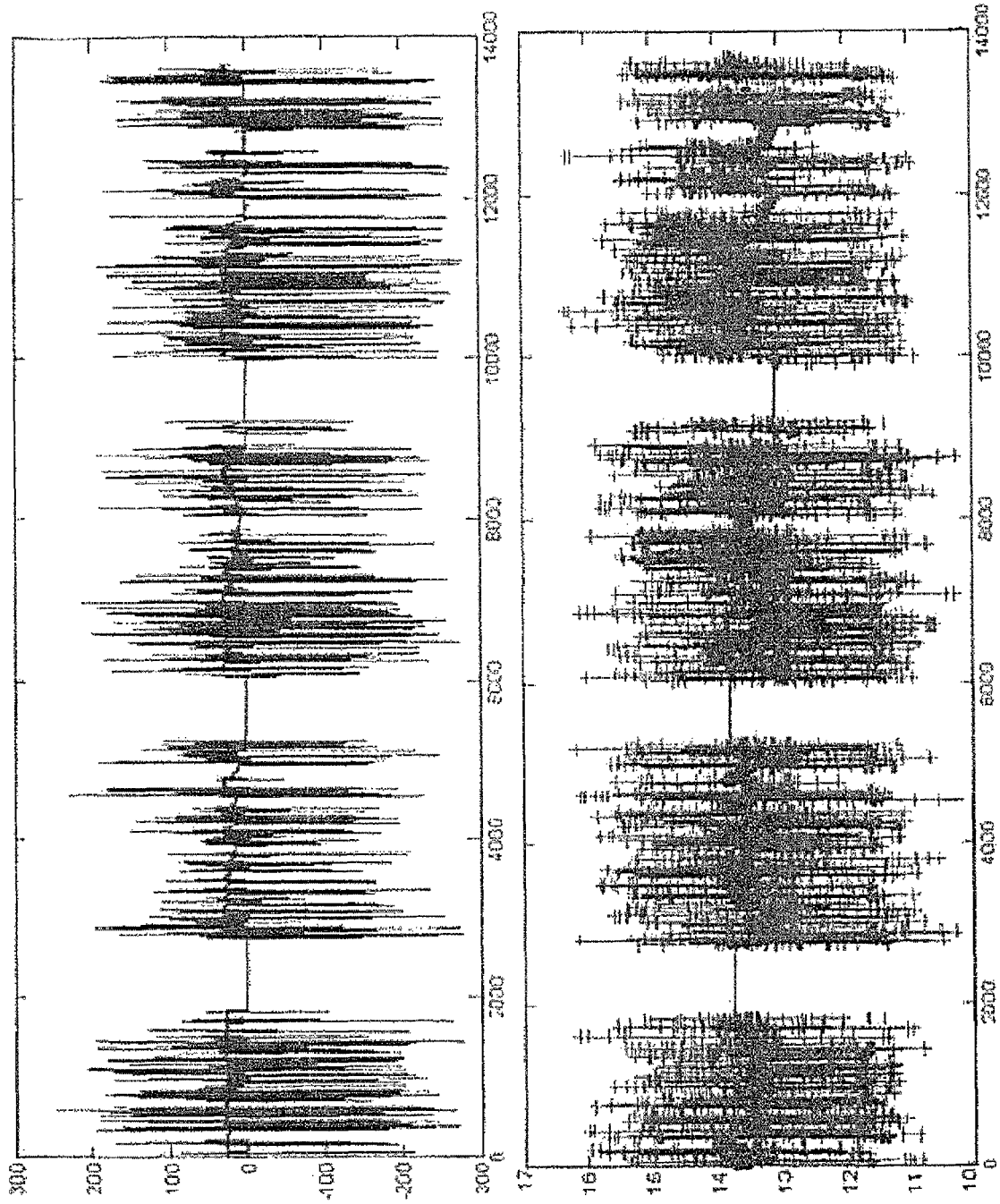
FIG. 4(a) is a graphical illustration of a sample of a measured battery current, according to one aspect of the present invention.
FIG. 4(b) is a graphical illustration of a sample of the filter response of a measured and predicted battery voltage without using the state equations system, according to one aspect of the present invention.

Referring now to FIGS. 4(a), 4(b), 5, 6(a) and 6(b), an example of the present invention's method of assessing the state of battery health of one or more batteries is described by way of showing the filter response of low sample-rate data from a hybrid electric vehicle application employing multiple traction batteries. FIGS. 4(a) and 4(b) are graphical illustrations of the filter response of a measured battery current and measured and predicted voltage according to one aspect of the present invention. In other words, in both FIG. 4(a) and FIG. 4(b), the filter is merely showing the propagation of each current and voltage filter in time (seconds). Accordingly, as seen in FIGS. 4(a) and 4(b), the current and voltages demonstrate that the raw output measured from any traction battery produced poorly sampled data where the peak values are not straight lines. In other words, applying the standard Ohm's law calculation to obtain the internal resistance value is not easily obtainable. Accordingly, it is necessary to apply the system state equations No. 1-3 above to model each traction battery to obtain an estimated internal resistance value.

Figure 5:
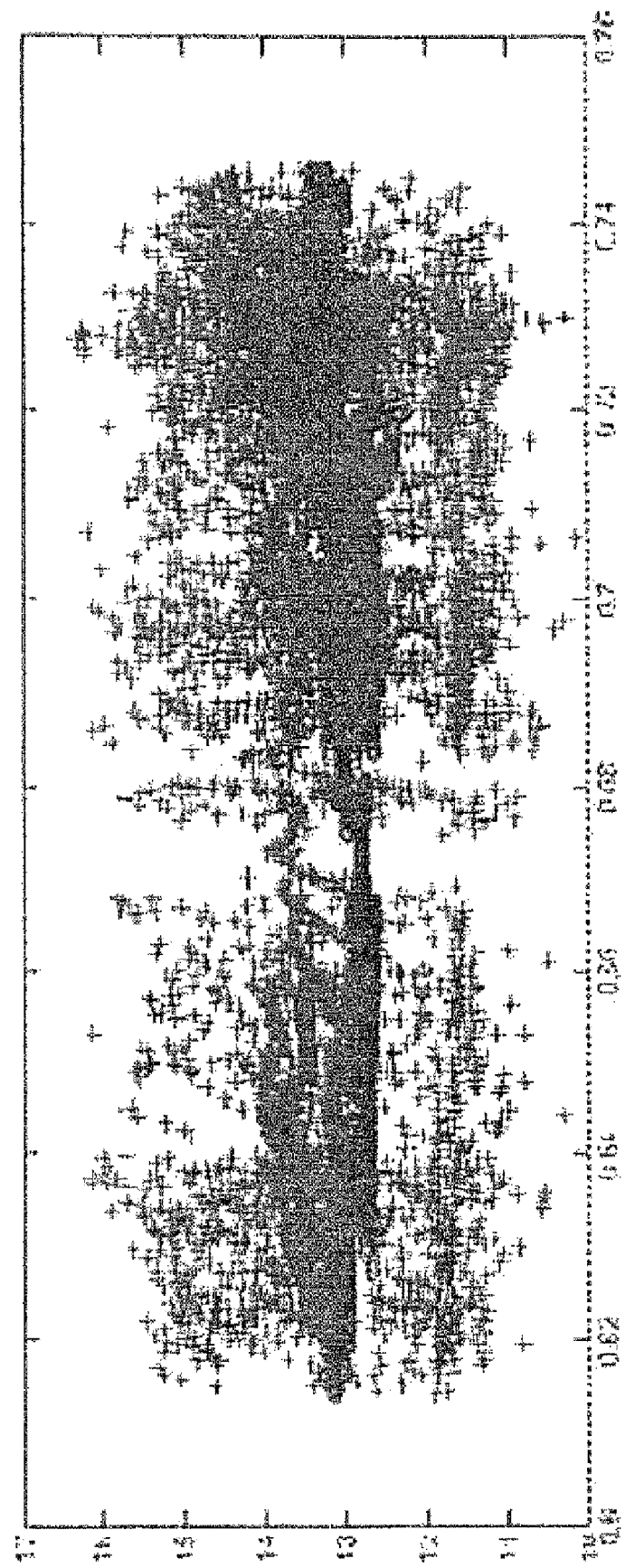
FIG. 5 is a graphical illustration of a sample of the filter response of the predicted battery voltage and open circuit voltage versus estimated state of charge (SOC) according to one aspect of the present invention.

In FIG. 5 a graphical illustration of a sample of the filter response of the predicted battery voltage and open circuit voltage versus estimated state of charge (SOC) according to one aspect of the present invention is shown.

Figure 6A:
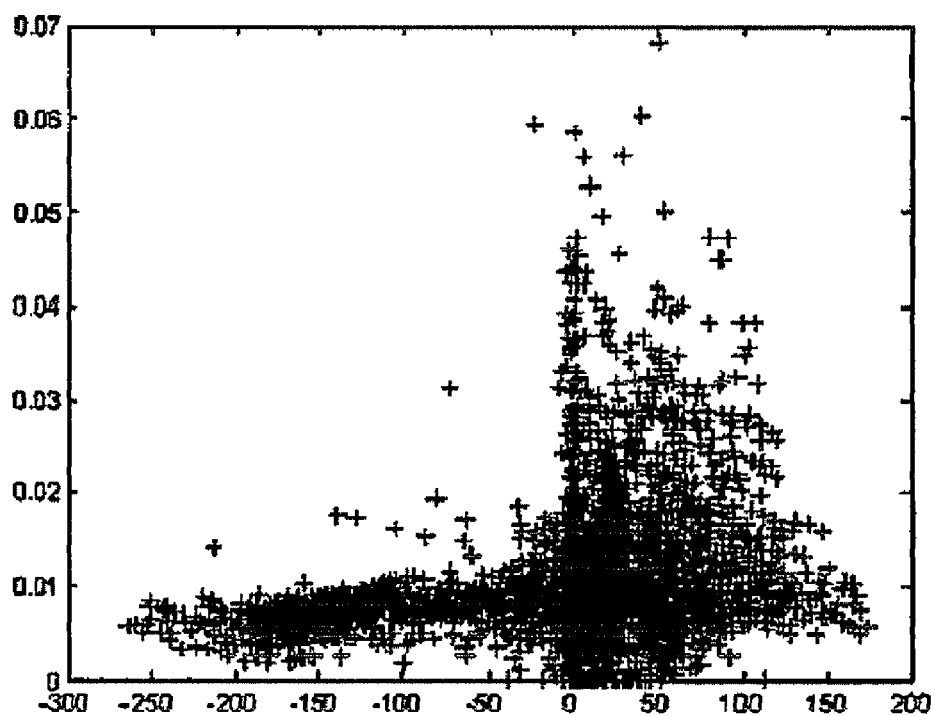
FIG. 6(a) is a graphical illustration of a sample of the filter response of internal resistance plotted against the measured current of a traction battery according to one aspect of the present invention.
Figure 6B:
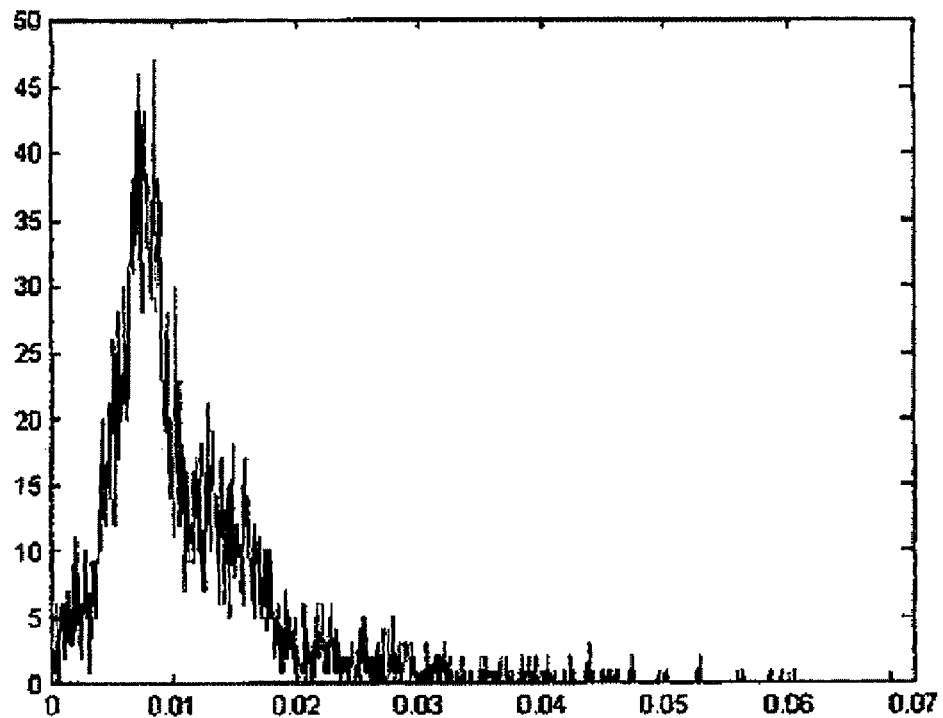
FIG. 6(b) is a graphical illustration of a of the filter response of a histogram of internal resistance of a traction battery, according to one aspect of the present invention.

FIG. 6(a) is a graphical illustration of a sample of the filter response of an internal resistance plotted against battery current of a traction battery according to one aspect of the present invention. As shown in FIG. 6(a), the internal resistance demonstrates more variability/scatter than would normally be useful to assess the battery health. This variation is attributed to high-frequency dynamics, which cannot be adequately accounted for by low speed sampling, process noise associated with modeling errors, state equations, and any measurements errors (biases or delays) in the voltage and current data. To remedy this situation as discussed, above a Kalman filter approach is employed. Hence, since the Kalman filter is stochastic in nature, the state estimates should be looked at stochastically.

Figure 7:
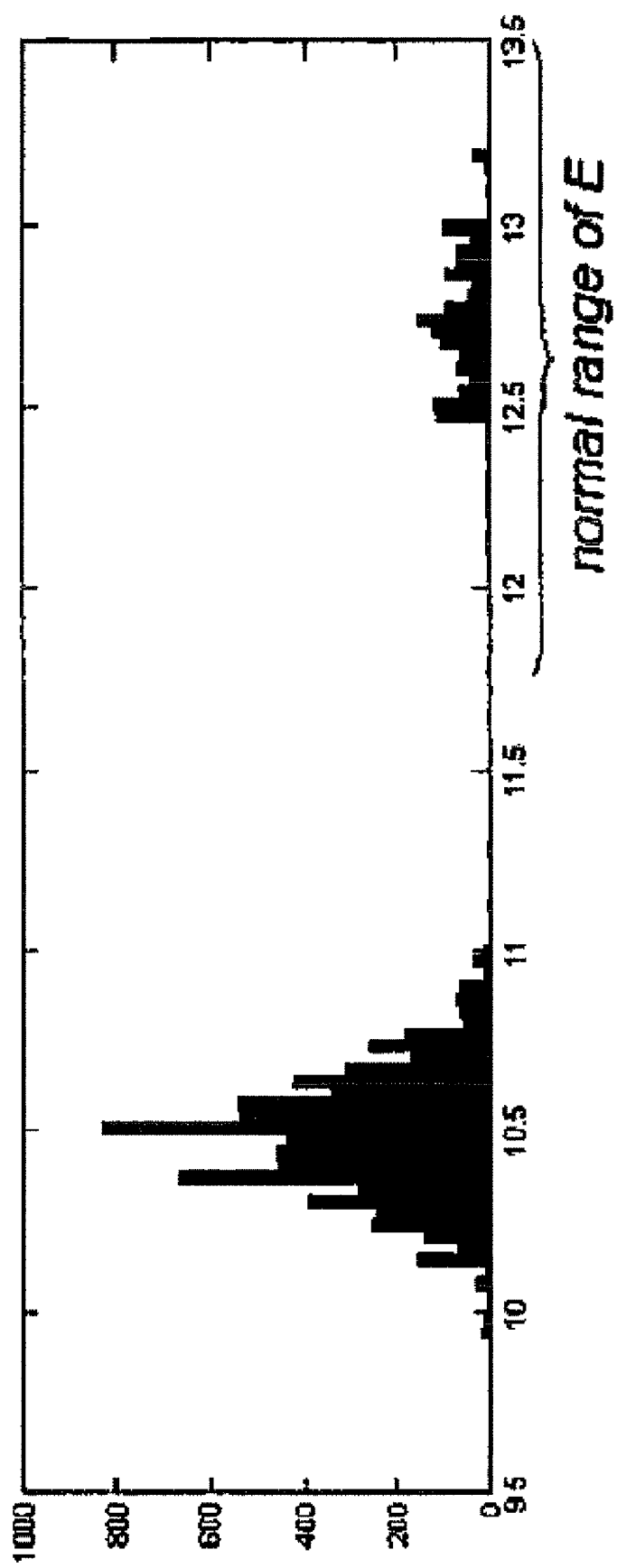
FIG. 7 is a graphical illustration of a sample of the filter response of a histogram of open circuit voltage of a traction battery with a shorted cell according to one aspect of the present invention.

FIG. 7 is a graphical illustration of a sample of the filter response of an internal resistance estimate versus voltage of a traction battery showing a shorted cell according to one aspect of the present invention. FIG. 7 illustrates the shorted cell detector module 140 of FIG. 1. When a shorted cell is present in a battery the battery actually is operating in two modes with respect to internal resistance. In normal operation a battery will operate in the 12 to 13 volt range. On the other hand, when a battery contains a shorted cell the battery's voltage will show for example a voltage in the 10 to 11 voltage range as shown in FIG. 7. Accordingly, the present invention determines if the peak value from OCV histogram is outside the nominal range.

It should be noted that other statistical properties of the internal resistance histogram (i.e., the mean and mode) can also provide detail as to the accuracy of the final estimate of the internal resistance (e.g., confidence bounds). The peaks from the internal resistance histogram can be generated after every operation (e.g., daily) using the Kalman filter state estimation technique. It can be trended daily and used in a simple logical expression to assess battery health, if (Ri–S) >Rcritical_threshold (i.e. critical resistance threshold), then battery is faulty or on the other hand, if Rcritical_threshold> (Ri–S) the battery is in no worse than a Blue Monday condition, where Ri is the peak sampled resistance value extracted from the cumulative histogram, and S is a standard deviation. The standard deviation S includes noise and an adjustment factor extracted from the cumulative histogram such that when it is subtracted from the peak sampled resistance value Ri results in providing the final estimate of the battery's internal resistance, otherwise referred to as the SOH of the battery. The standard deviation S can be determined using techniques well known to those skilled in the art such as and in literature such as, for example, *Intuitive Probability and Random Processes using Matlab*, by Steve Kay, page 356, published by Springer in 2006.

This technique can be applied to batteries, which were known to be faulty and were shown to trend in a fashion similar to other approaches (specifically, behaves similarly to outlier detection techniques). One obvious advantage of this approach is that it allows the estimation of battery health for a single battery using low sample-rate data. The technique also provides statistical measures as to the adequacy of the internal resistance estimate. Note that the open circuit voltage of a battery also varies as the health of the battery degrades. Typically the open circuit voltage will vary with the state of charge within the battery. As the battery degrades, the open circuit voltage determined from the SOC may operate below its nominal value computed from the state of charge. This open circuit voltage can be compared to a predetermined nominal value. If it falls below the nominal value, then the battery may be deemed unhealthy.

Modern batteries used for high-power applications (hybrid vehicles, etc.) are typically composed of a number of internal cells connected in series or parallel. Overall degradation of the cells is typically noted as in the increase of battery impedance or the reduction of open circuit voltage. Besides age/usage-related cell degradation, the cells may exhibit shorts or opens. An open cell is easily detected (e.g. current measurements are zero and the full battery voltage appears across the cell), but a shorted cell is less obvious. Inspection of battery voltage may not easily indicate a shorted cell as the voltage variation is related to open circuit voltage, impedance and current. However, if the open circuit voltage is examined, a short will be evident, particularly if the histogram of open circuit voltage is generated as shown in FIG. 7. In FIG. 7, the open circuit voltage would have a peak within some nominal range. A shorted cell appears as a peak at a value markedly out of range from the nominal value.

As will be readily apparent to those skilled in the art, the present invention or aspects of the invention can be realized in hardware, or as some combination of hardware and software. Any kind of computer/server system(s)—or other apparatus adapted for carrying out the methods described herein—is suitable. A typical combination of hardware and software could be a general-purpose computer system with a computer program that, when loaded and executed, carries out methods described herein. Alternatively, a special purpose computer, containing specialized hardware for carrying out one or more of the functional tasks of the invention, could be utilized.

The present invention or aspects of the invention can also be embodied in a computer program product, which comprises all the respective features enabling the implementation of the methods described herein, and which—when loaded in a computer system—is able to carry out these methods. Computer program, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

What is claimed is:

1. A method of estimating a state of health (SOH) of one or more batteries, comprising the steps of:
    estimating a sampling of internal resistances of said one or more batteries;
    generating a time history of said internal resistances over a predetermined amount of time;
    generating a cumulative internal resistance histogram from said time history using said internal resistances in relation to said predetermined amount of time;
    calculating a final estimate of the internal resistance of said one or more batteries which represents a calculated SOH of said one or more batteries; and
    comparing said calculated SOH to a predetermined critical resistance threshold for determining if said one or more batteries are in a failed condition.

2. The method of claim 1, wherein if said calculated SOH is less than the predetermined critical resistance threshold, one or more batteries are in no worse than a Blue Monday condition, and if said calculated SOH is more than the critical resistance threshold, then said one or more batteries has failed.

3. The method of claim 1, wherein the sampling of internal resistances are estimated by employing a state estimator.

4. The method of claim 3, wherein the state estimator is a Kalman filter.

5. The method of claim 1, wherein the step of generating a cumulative histogram further includes the step of setting a smallest partition in said internal resistance histogram to zero count.

6. The method of claim 1 further comprising the steps of:
    generating an open circuit voltage (OCV) histogram of a nominal open circuit voltage from each of said one or more batteries;
    selecting a peak OCV value from said generated OCV histogram; and
    comparing said selected peak OCV value to a predetermined nominal range, wherein if said selected peak OCV value is outside said predetermined nominal range, said one or more batteries has a shorted cell.

7. The method of claim 1 further comprising the steps of:
    estimating an open circuit voltage (OCV) of said one or more batteries as a function of a predetermined state of charge;
    comparing said estimated OCV to a predetermined nominal value, wherein if said estimated OCV is below said predetermined nominal value said one or more batteries are degraded.

8. A system of estimating a state of health (SOH) of one or more batteries, comprising:
    means for estimating a sampling of internal resistances of said one or more batteries;
    means for generating a time history of said sampling of internal resistances over a predetermined amount of time;
    means for generating a cumulative internal resistance histogram from said time history using said internal resistances in relation to said predetermined amount of time;
    means for calculating a final estimate of internal resistance of said one or more batteries which represents a calculated SOH of said one or more batteries; and
    means for comparing said calculated SOH to a predetermined critical resistance threshold for determining if said one or more batteries are in a failed condition.

9. The system of claim 8, wherein if said calculated SOH is less than the predetermined critical threshold said battery is in no worse than a Blue Monday condition, and if said calculated SOH is more than the critical resistance threshold, then said one or more batteries has failed.

10. The system of claim 8, wherein the means for estimating the sampling of internal resistances employs a state estimator.

11. The system of claim 10, wherein the state estimator is a Kalman filter.

12. The system of claim 8, wherein the means for generating a cumulative histogram further includes a means for setting a smallest partition in said internal resistance histogram to zero count.

13. The system of claim 8 further comprising:
    means for generating an open circuit voltage (OCV) histogram of a nominal open circuit voltage from each of said one or more batteries;
    means for selecting a peak OCV value from said generated OCV histogram; and
    means for comparing said selected peak OCV value to a predetermined nominal value, wherein if said selected peak OCV value is below said predetermined nominal value, said one or more batteries has a shorted cell.

14. The system of claim 8 further comprising:
    means for estimating an open circuit voltage (OCV) of said one or more batteries as a function of a predetermined state of charge;
    means for comparing said estimated OCV to a predetermined nominal value, wherein if said estimated OCV is below said predetermined nominal value, said one or more batteries are degraded.

15. A method of determining if one or more batteries are shorted, comprising the steps of:
    generating an open circuit voltage (OCV) histogram of a nominal open circuit voltage from each of said one or more batteries;
    selecting a peak OCV value from said generated OCV histogram; and
    comparing said selected peak OCV value to a predetermined nominal range, wherein if said selected peak OCV value is outside said predetermined nominal range, said one or more batteries has a shorted cell.

16. The method of claim 15 further comprising the steps of:
    estimating an open circuit voltage (OCV) of said one or more batteries as a function of a predetermined state of charge;
    comparing said estimated OCV to a predetermined nominal value, wherein if said estimated OCV is below said predetermined nominal value, said one or more batteries are degraded.

17. The method of claim 15 further comprising the steps of:
    estimating a sampling of internal resistances of said one or more batteries;
    generating a time history of said sampling of internal resistances over a predetermined amount of time;
    generating a cumulative internal resistance histogram from said time history using said internal resistances in relation to said predetermined amount of time;

calculating a final estimate of internal resistance of said one or more batteries which represents a calculated SOH of said one or more batteries; and comparing said calculated SOH to a predetermined critical resistance threshold, wherein if said calculated SOH is less than the predetermined critical resistance threshold, said battery is in no worse than a Blue Monday condition, and if said calculated SOH is greater than the critical resistance threshold, then said one or more batteries has failed.

18. The method of claim 17, wherein the sampling of the internal resistances are estimated by employing a state estimator.

19. The method of claim 17, wherein the step of generating a cumulative histogram further includes the step of setting a smallest partition in said cumulative internal resistance histogram to zero count.

20. A computer program product comprising non-transitory computer usable medium having computer readable program code embodied therein for enabling a computer to estimate a state of health (SOH) of one or more batteries, and for causing the computer to activate the steps of:

estimating a sampling of internal resistances of said one or more batteries;

generating a time history of said internal resistances over a predetermined amount of time;

generating a cumulative internal resistance histogram from said time history using said internal resistances in relation to said predetermined amount of time;

calculating a final estimate of internal resistance of said one or more batteries which represents a calculated SOH of said one or more batteries; and comparing said calculated SOH to a predetermined critical resistance threshold, wherein if said calculated SOH is less than the predetermined critical threshold, said battery is in no worse than a Blue Monday condition, and if said calculated SOH is greater than the critical resistance threshold, then said one or more batteries has failed.

\* \* \* \* \*